(12) United States Patent
Rieschl et al.

(10) Patent No.: US 9,490,166 B2
(45) Date of Patent: Nov. 8, 2016

(54) APPARATUS AND METHOD FOR DEPOSITING A LAYER ONTO A SUBSTRATE

(75) Inventors: Sven Uwe Rieschl, Malans (CH); Mohamed Elghazzali, Feldkirch (AT); Jürgen Weichart, Balzers (LI)

(73) Assignee: EVATEC AG, Trubbach (CH)

( * ) Notice: Subject to any disclaimer, the term of this patent is extended or adjusted under 35 U.S.C. 154(b) by 0 days.

(21) Appl. No.: 13/822,125

(22) PCT Filed: Dec. 7, 2011

(86) PCT No.: PCT/IB2011/055526
§ 371 (c)(1),
(2), (4) Date: Jul. 22, 2013

(87) PCT Pub. No.: WO2012/077071
PCT Pub. Date: Jun. 14, 2012

(65) Prior Publication Data
US 2013/0288477 A1    Oct. 31, 2013

Related U.S. Application Data

(60) Provisional application No. 61/420,853, filed on Dec. 8, 2010.

(51) Int. Cl.
*H01L 21/768* (2006.01)
*C23C 14/50* (2006.01)
(Continued)

(52) U.S. Cl.
CPC ......... *H01L 21/76838* (2013.01); *C23C 14/50* (2013.01); *C23C 14/541* (2013.01); *C23C 16/4585* (2013.01); *C23C 16/466* (2013.01);
(Continued)

(58) Field of Classification Search
None
See application file for complete search history.

(56) References Cited

U.S. PATENT DOCUMENTS 5,175,929 A * 1/1993 Anthony et al. ......... 29/890.142
5,328,722 A * 7/1994 Ghanayem et al. .......... 427/250
(Continued)

FOREIGN PATENT DOCUMENTS

CN    1231505 A    10/1999
CN    100343956 C    10/2007
(Continued)

OTHER PUBLICATIONS

International Search Report for PCT/IB2011/055526 dated Apr. 11, 2012.
(Continued)

*Primary Examiner* — Joseph Miller, Jr.
(74) *Attorney, Agent, or Firm* — Pearne & Gordon LLP

(57) ABSTRACT

Apparatus (1, 26) for depositing a layer (37, 38, 39) on a substrate (2) in a process gas comprises a chuck (3) comprising a first surface (4) for supporting the substrate (2), a clamp (4) for securing the substrate (2) to the first surface (14) of the chuck (3), an evacuatable enclosure (5) enclosing the chuck (3) and the clamp (4) and comprising an inlet, through which the processing gas is insertable into the enclosure (5), and control apparatus (19). The control apparatus (19) is adapted to move at least one of the chuck (3) and the clamp (4) relative to, and independently of, one another to adjust a spacing between the chuck (3) and the clamp (4) during a single deposition process while maintaining a flow of the processing gas and a pressure within the enclosure (5) that is less than atmospheric pressure.

16 Claims, 6 Drawing Sheets

Figure 1:
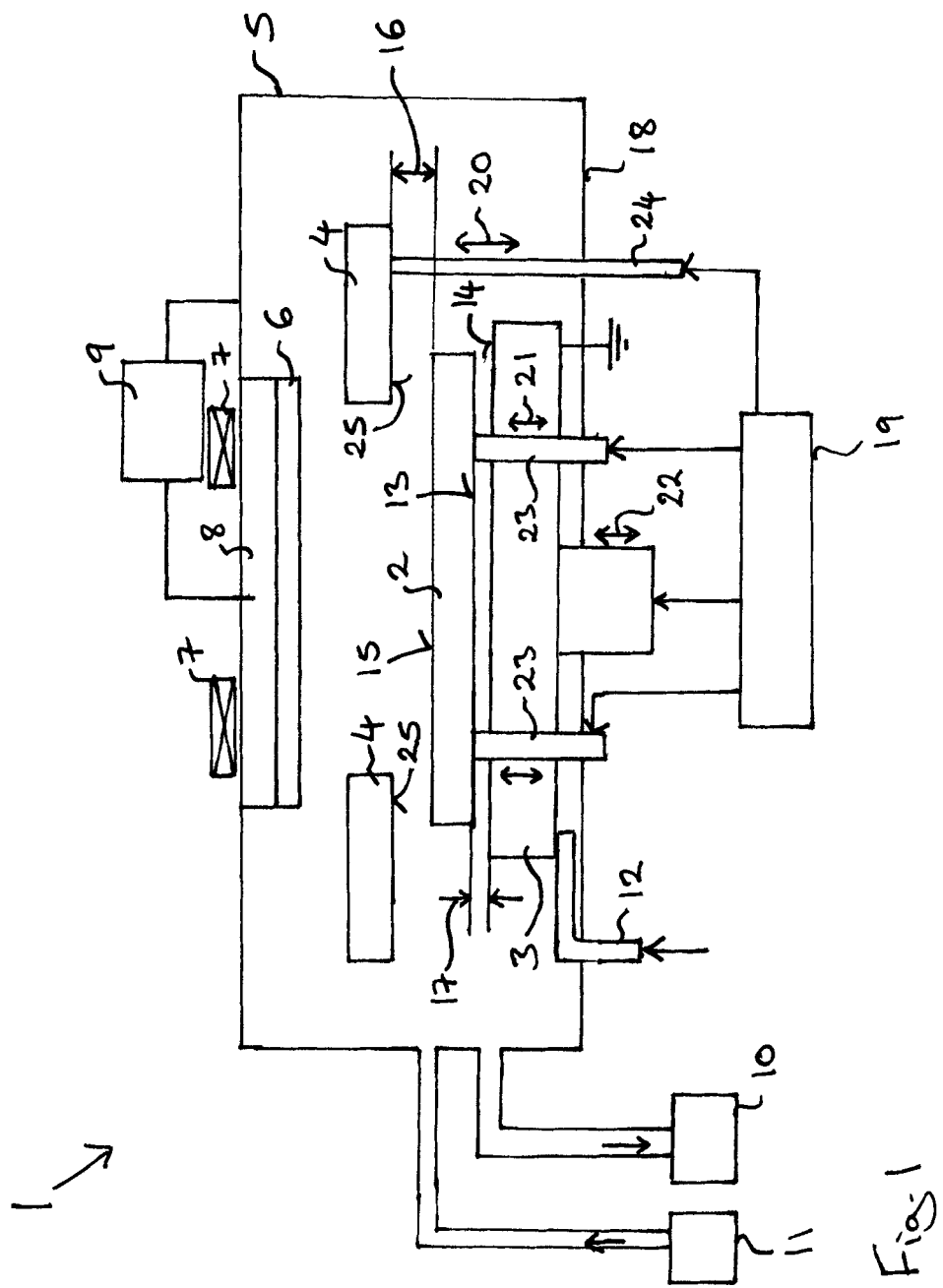

(51) Int. Cl.
  *C23C 14/54* (2006.01)
  *C23C 16/458* (2006.01)
  *C23C 16/46* (2006.01)
  *H01L 21/687* (2006.01)
  *H01L 21/285* (2006.01)

(52) U.S. Cl.
  CPC ..... H01L 21/2855 (2013.01); H01L 21/68721 (2013.01); H01L 21/68735 (2013.01); H01L 21/68764 (2013.01); H01L 21/76873 (2013.01)

(56) References Cited

U.S. PATENT DOCUMENTS

| | | | |
|---|---|---|---|
| 5,484,011 A | 1/1996 | Tepman et al. | |
| 5,725,718 A * | 3/1998 | Banholzer et al. | 156/345.51 |
| 8,252,375 B2 * | 8/2012 | Moffat | B05D 1/60 118/715 |
| 2001/0040264 A1 | 11/2001 | Ito | |
| 2002/0066411 A1 * | 6/2002 | Chiang | C23C 16/0227 118/724 |
| 2003/0215578 A1 | 11/2003 | Okumura | |
| 2006/0011136 A1 * | 1/2006 | Yamazaki et al. | 118/719 |
| 2007/0254101 A1 | 11/2007 | Handa et al. | |
| 2008/0135207 A1 * | 6/2008 | Fukuoka | H01L 21/67109 165/65 |

FOREIGN PATENT DOCUMENTS

| | | |
|---|---|---|
| CN | 100572596 C | 12/2009 |
| WO | 2011/061695 A2 | 11/2010 |

OTHER PUBLICATIONS

Written Opinion for PCT/IB2011/055526 dated Apr. 11, 2012.

\* cited by examiner

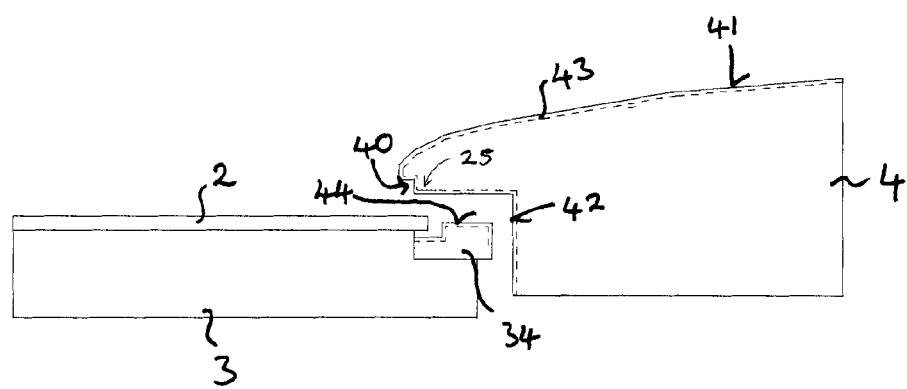
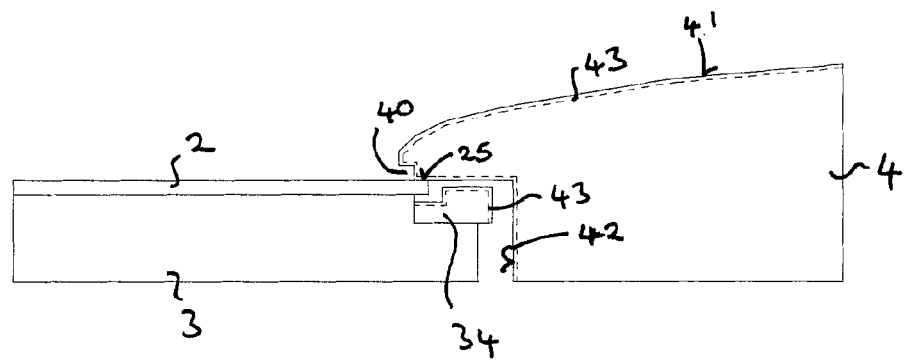
Fig. 7

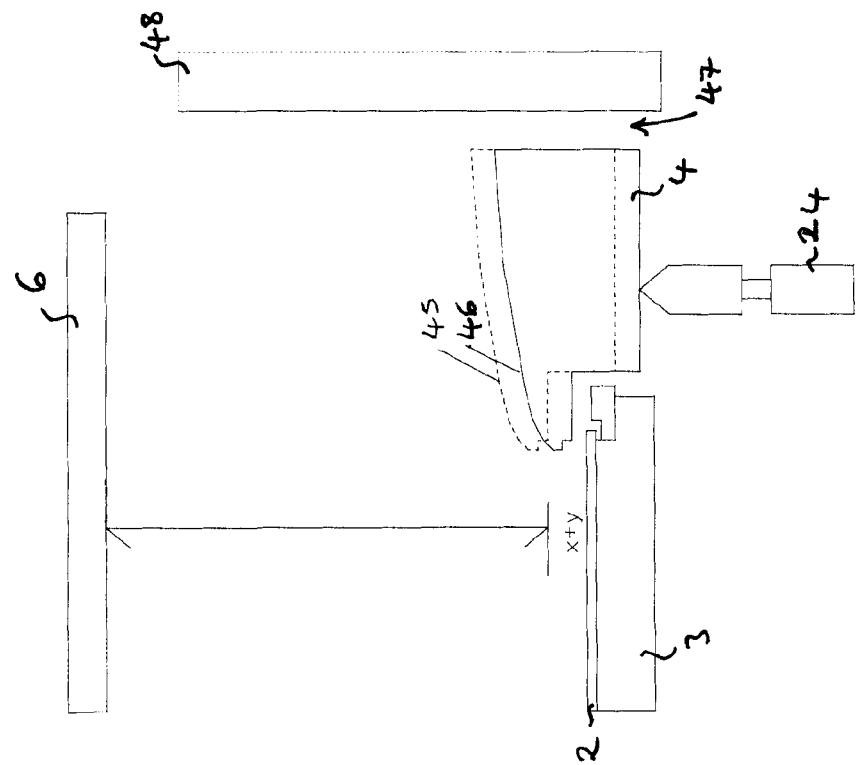
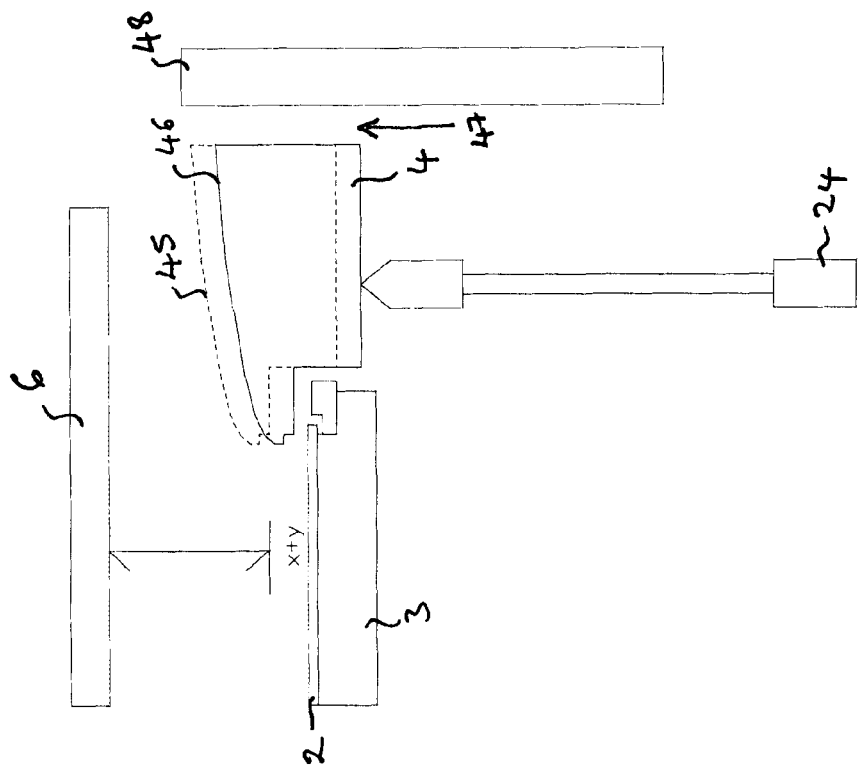
Fig. 8

APPARATUS AND METHOD FOR DEPOSITING A LAYER ONTO A SUBSTRATE

The present invention relates to apparatus and methods for depositing a layer onto a substrate, in particular, a metallic layer onto a substrate comprising a semiconductor.

Layers may be deposited onto substrates using a variety of methods. Some methods, for example electro-deposition, spray coating and dip coating, may be carried out at atmospheric pressure. Other deposition methods are carried out at pressures lower than ambient atmospheric pressure by depositing the layer within an evacuated enclosure. Deposition processes at reduced pressure may be referred to as vacuum deposition processes. Vacuum deposition processes include methods such as chemical vapour deposition (CVD), including plasma enhanced chemical vapour deposition (PECVD) and physical vapour position deposition techniques, such as sputtering and evaporation.

The various methods may be combined to produce a suitable layer. For example, a vacuum deposition treatment may be used to deposit a seed layer on an insulating substrate and an atmospheric deposition method, such as electro-deposition, may be used to deposit a further layer onto the seed layer.

WO 2011/061695 A2 discloses a method of processing a substrate that displays outgassing when placed in a vacuum. The substrate may comprise a composite including semiconductor portions, for example in the form of silicon chips, embedded in a plastic matrix. One or more metallic layers are deposited onto this substrate to form a rewiring structure. WO 2011/061695 A2 discloses a method by which outgassing from the substrate may be better controlled to achieve a steady state balance in which the outgassing rate is determined solely by the diffusion rate in order to reduce the overall contamination of the substrate.

However, further improvements to apparatus and methods for depositing layers on substrates, in particular metallic layers on substrates comprising semiconductive material are desirable.

A method for depositing a layer onto a substrate is provided that comprises the following. A substrate is inserted into an evacuatable enclosure and positioned between a clamp and a chuck arranged within the enclosure. Whilst a pressure within the enclosure is less than atmospheric pressure, a processing gas is supplied to the enclosure, a first layer is deposited onto the substrate whilst supplying the processing gas and whilst a first side of the substrate is spaced at a distance from the clamp. The clamp is brought into physical contact with the first side of the substrate and a further layer is deposited onto the first layer whilst maintaining the supply of the processing gas and the pressure in the enclosure at less than atmospheric pressure and whilst the clamp is in physical contact with the first side of the substrate and secures the substrate to the chuck.

According to this method, the layer is deposited on the substrate in a two stage process. In the first stage, the first layer is deposited directly onto the surface of substrate whilst the clamp is spaced at a distance from the front side of substrate. In the second stage, the clamp is brought into physical contact with the first side of the substrate and, in particular, with the first layer already deposited on the substrate. Both the stages are carried out in a single process sequence in which the pressure within the enclosure is maintained at less than atmospheric pressure and the supply of the processing gas to the enclosure is maintained. The enclosure is, therefore, not opened to move the clamp so that it is in physical contact with the substrate and secures the substrate to the chuck. The two stage process including the movement of the clamp may be carried out automatically using a suitably programmed control unit, for example.

The supply of processing gas is maintained and the pressure of the enclosure is maintained at less than ambient pressure during deposition of a layer when the clamp is not in contact with the substrate and when the clamp is in contact with the substrate. However, the phrasing maintained is not used to limit the method to one in which the flow rate of the processing gas and the pressure is held constant, but includes methods in which the flow rate of the processing gas supply and the level of the pressure may vary over the deposition time as long as there is a supply of processing gas to the enclosure and the pressure within the enclosure remains at a value less than atmospheric pressure.

The method results in the deposition of a layer in which the regions positioned under the clamp during the deposition of the further layer have a thickness which is less than thickness of the total layer in regions not covered by the clamp during deposition of the further layer. The first layer may extend over the entire first side of substrate as the clamp is spaced at a distance from substrates during the deposition of first layer. Therefore, the first layer can act to protect the material of the substrate from direct physical contact with the clamp.

In an embodiment, the substrate is placed in contact with a first surface of a chuck before depositing the first layer. The first layer may then be deposited whilst the substrate is supported on the first surface of the chuck. The substrate may also be in physical contact with, and be supported on, the first surface of the chuck during the deposition of the further layer. The clamp is also in physical contact with the opposing side of the substrate during the deposition of the further layer so that the substrate can be considered as being mechanically sandwiched between the clamp and the chuck during deposition of the further layer.

In an embodiment, the substrate is placed on moveable pins, for example extendable and retractable pins, which protrude above the first surface of the chuck and space the substrate at a distance from the chuck. The substrate may be placed on the first surface of the chuck by retracting the pins. The pins act as a loading/unloading system for the substrate. A loading arm for inserting the substrate into the enclosure may better avoid coming into contact with the chuck by the use of these movable pins. Scratching of the rear side of the wafer is also better avoided as it does not slide mechanically across the surface of the chuck.

In an embodiment, the clamp is supported on movable pins and the pins are moved so as to position the clamp spaced at a distance above the first side of the substrate during deposition of the first layer. The clamp is movable with respect to the substrate and with respect to the chuck and independently of the position of the substrate and of the chuck. This not only enables deposition of a layer without the clamp being in contact with the substrate and whilst the clamp is in contact with the substrate, but also allows such a method to be carried out for substrates having different thicknesses. This embodiment also allows for the target to substrate distance to be adjusted for a physical vapour deposition process in which material from a source, commonly referred to as a target, is deposited onto the substrate.

The clamp may be brought into contact with the first side of the substrate by retracting the pins. This may be carried out after a pre-determined time span and/or after the first layer has reached a pre-determined thickness. The thickness of the first layer may be controlled by pre-defining the deposition time, i.e. the time span. Alternatively, the thickness of the first layer may be monitored directly and when it is determined that the first layer has the desired thickness, the clamp may be brought into contact with the substrate by retracting the pins.

In some embodiments, the chuck is movable and the chuck is moved relative to, and independent of, the clamp and the clamp is brought into contact with the first side of the substrate. In these embodiments, the clamp may be immovable or movable.

In an embodiment, the first layer is deposited without active cooling of the substrate. This avoids the possibility that the substrate moves due to the active cooling. This may occur if a gas flow is used to actively cool the substrate, for example.

The further layer may be deposited with active cooling of the substrate. The active cooling may be switched on after the substrate has been secured to the substrate by the clamp. In this embodiment, movement of the substrate due to the active cooling is avoided, since the clamp secures the substrate to the chuck, thus preventing movement of the substrate during the deposition of the further layer.

The substrate may be actively cooled by passing a flow of gas over a second side of the substrate or over the chuck. The chuck may comprise a cooling circuit through which a liquid or a gas flows to remove heat from the chuck and, therefore, from the substrate detachedly attached to the chuck.

The method may be used for physical vapour deposition methods and chemical vapour deposition methods. In the case of physical vapour deposition of material from a material source, energy is applied to a material source comprising the material to be deposited whereby portions of the material source are removed, deposited onto the substrate and form a layer on the first side of the substrate.

The material source may be a disc of solid material in the case of sputter deposition or an irregular shape in the case of thermal or electron beam evaporation. The energy to be supplied also depends on the type of deposition. In the case of sputtering, it may be the application of a voltage to the material source. In the case of evaporation, it may be directing an electron beam onto the source material, for example.

The portions of the material source that are removed may comprise one or more metal elements which are deposited onto the substrate and form a metallic layer on the substrate. The metallic layer may be electrically conductive.

If chemical vapour deposition techniques are used, the method further comprises supplying gaseous material to the enclosure. The gaseous material may comprise one of more compounds with one or more elements which are to be deposited onto the substrate. The compounds decompose within the chamber, releasing the one or more elements which are deposited onto the substrate and form a layer. The further components formed from the decomposition of the gaseous material, such as organic molecules and/or oxygen, are removed from the enclosure by an evacuation and trap system.

The gaseous material may be selected so that the one or more elements react within the chamber and are deposited onto the substrate and form a metallic layer on the substrate.

In an embodiment, the substrate comprises a semiconductor, or a semiconductor wafer, or a composite comprising semiconductor portions embedded in a plastic matrix. The layer deposited on these substrates may be an electrically conductive metal layer. The metal layer may provide the rewiring layer for integrated circuit devices included in the semiconductor, metallization or may serve as an electrically conductive seed layer onto which a thicker metal layer is grown, for example by electro- or galvanic deposition.

The first layer is deposited for a first time span and the further layer is deposited for a second time span. The first and second time spans may be pre-defined in order that the first layer and the further layer have a pre-defined thickness. This method may be used if the deposition rate of the material forming the first and further layer is known.

In an embodiment, the first layer and the further layer are deposited over a total time span and the first time span is between 1% and 50% of the total time span or the first time span is between 10 to 20% of the total time span. The second time span is between 50% and 99% of the total time span or between 80% to 90% of the total time span.

A shorter time span for the first layer may be desirable if the substrate is not actively cooled during deposition of the first layer in order to limit the temperature rise of the substrate.

A longer time span for the first layer may be desirable if the regions under the clamp during the deposition of the further layer are to have a greater thickness. For example, very thin metallic layers may have a high resistance which may be undesirable if the thinner regions of the layer are to serve as electrically conductive contact areas for example.

Apparatus for depositing a layer on a substrate in a processing gas is also provided. The apparatus comprises a chuck comprising a first surface for supporting a substrate, a clamp for securing the substrate to the first surface of the chuck, an evacuatable enclosure enclosing the chuck and the clamp and having an inlet through which the processing gas is insertable into the enclosure, and control apparatus. The control apparatus is adapted to move the chuck and/or the clamp relative to, and independently of, one another to adjust the spacing between the chuck and the clamp during a single deposition process whilst maintaining a flow of the processing gas and a pressure within the enclosure that is less than atmospheric pressure.

The apparatus is suitable for reduced pressure deposition processing techniques as the enclosure is evacuatable. The apparatus is also suitable for carrying out the method according to one of the previously described embodiments as the control apparatus is adapted to move the chuck and/or clamp relative to one another during a single deposition process. The enclosure does not have to be opened and the enclosure have an ambient atmosphere in order to move the chuck and/or clamp relative to one another.

The control apparatus may be adapted to provide this feature by being suitably programmed to control actuating means which are coupled to the clamp and/or chuck. The actuating means are coupled to the clamp and/or chuck positioned within the enclosure such that the clamp and/or chuck may be moved without breaking the vacuum or seal of the enclosure.

In an embodiment, the control apparatus is adapted to bring the clamp into physical contact with the substrate and secure the substrate to the first surface of the chuck during a single deposition process whilst maintaining a flow of the processing gas and whilst maintaining a pressure within the enclosure that is less than atmospheric pressure.

For example, the control apparatus may be adapted to move the clamp and/or chuck such that a pre-defined distance which corresponds to the thickness of the substrate is provided between the clamp and the chuck thereby mechanically securing the substrate between the clamp and the chuck. Alternatively, the control apparatus may be adapted to withdraw support to the clamp to allow the clamp to rest under its own weight on the substrate and mechanically secure the substrate to the chuck.

The apparatus may further comprise a first height adjuster for supporting the clamp. The first height adjuster is moveable to adjust the distance between the clamp and the chuck.

The apparatus may also further comprise a second height adjuster for supporting the substrate, the second height adjuster being moveable to adjust the distance between the substrate and the chuck and to adjust the distance between the substrate and the clamp.

A third height adjuster for adjusting the height of the chuck relative to the clamp may also be provided.

At least one of the first height adjuster and the second height adjuster may comprise a plurality of pins, for example three pins. The pins are moveable in directions perpendicular to the major plane of the clamp and the first surface of the chuck.

In an embodiment, the clamp comprises an undercut in a surface facing towards the first surface of the chuck. The undercut may be positioned so as to reduce the contact area between the clamp and the substrate while, at the same time, the portion covering the cutout provides a larger shielding or masking effect due to the portion protruding over the undercut.

The clamp may comprise a surface that faces towards the first surface of the chuck and is generally parallel to the first surface of the chuck. This surface provides a clamping surface for securing the substrate to the first surface of the chuck. This arrangement is suitable for securing planar substrates such as wafers to the chuck.

The material to be deposited onto the substrate typically impinges the first side of the substrate from directions above the clamp since the clamp is positioned adjacent the first side of the substrate. In this case, the material to be deposited onto the substrate may also be deposited on the clamp, for example in regions of the clamp immediately adjacent the substrate.

In an embodiment, the clamp comprises a roughened surface that faces away from the first surface of the chuck. The material which is deposited onto the substrate also tends to be deposited on the clamp at least in regions immediately adjacent the substrate. The roughened surface increases the adhesion of the deposited material to the clamp and prevents it from flaking or becoming detached whereby it may fall onto the substrate and contaminate the substrate.

The apparatus may further comprise cooling apparatus for cooling the chuck. The cooling apparatus may comprise a cooling circuit with a heat exchanger positioned outside of the enclosure. A coolant such as a gas or a liquid may be forced to flow through the cooling circuit so as to remove heat from the chuck and, consequently, from a substrate in contact with the chuck by thermal conduction.

To enable deposition of a layer under reduced pressure, the apparatus may further comprise an evacuation system for evacuating the deposition chamber. The evacuation system may comprise one or more vacuum pumps, for example a rotary pump and a diffusion pump or a rotary pump and a turbopump.

The apparatus may further comprise a holder for holding a material source comprising material to be deposited onto the substrate. This embodiment is used if the layer is to be deposited using a physical vapour deposition technique such as sputtering or evaporation. The material source may be arranged so that it directly faces the front side of the substrate onto which the layer is to be deposited. In this arrangement, the clamp is positioned between the substrate and the material source.

The apparatus may further comprise an energy source for supplying energy to the material source and for removing portions of the material source. These removed portions of the material source are deposited onto the substrate to build up the first layer and the further layer.

If the layer is to be deposited using chemical vapour deposition, the apparatus may further comprising a gas supply system for supplying gaseous material to the evacuatable enclosure, the gaseous material comprising one or more elements to be deposited onto the substrate in the form of a layer.

In an embodiment, the control apparatus is programmed to move the clamp relative to the substrate after a pre-determined deposition time and secure the substrate to the chuck with the clamp. This control apparatus enables the thickness of the first layer in the regions positioned under the clamp to be defined by the pre-determined deposition time.

The apparatus may further comprise a layer thickness monitor. In this embodiment, the control apparatus may be programmed to move the clamp relative to the substrate and secure the substrate to the chuck with the clamp after the first layer has a pre-defined thickness. A thickness monitor may be used if the thickness of the deposited layer cannot be pre-defined by the deposition time span or is not sufficiently accurately estimatable by measuring the deposition time.

Embodiments will now be described with reference to the drawings.

Figure 2:
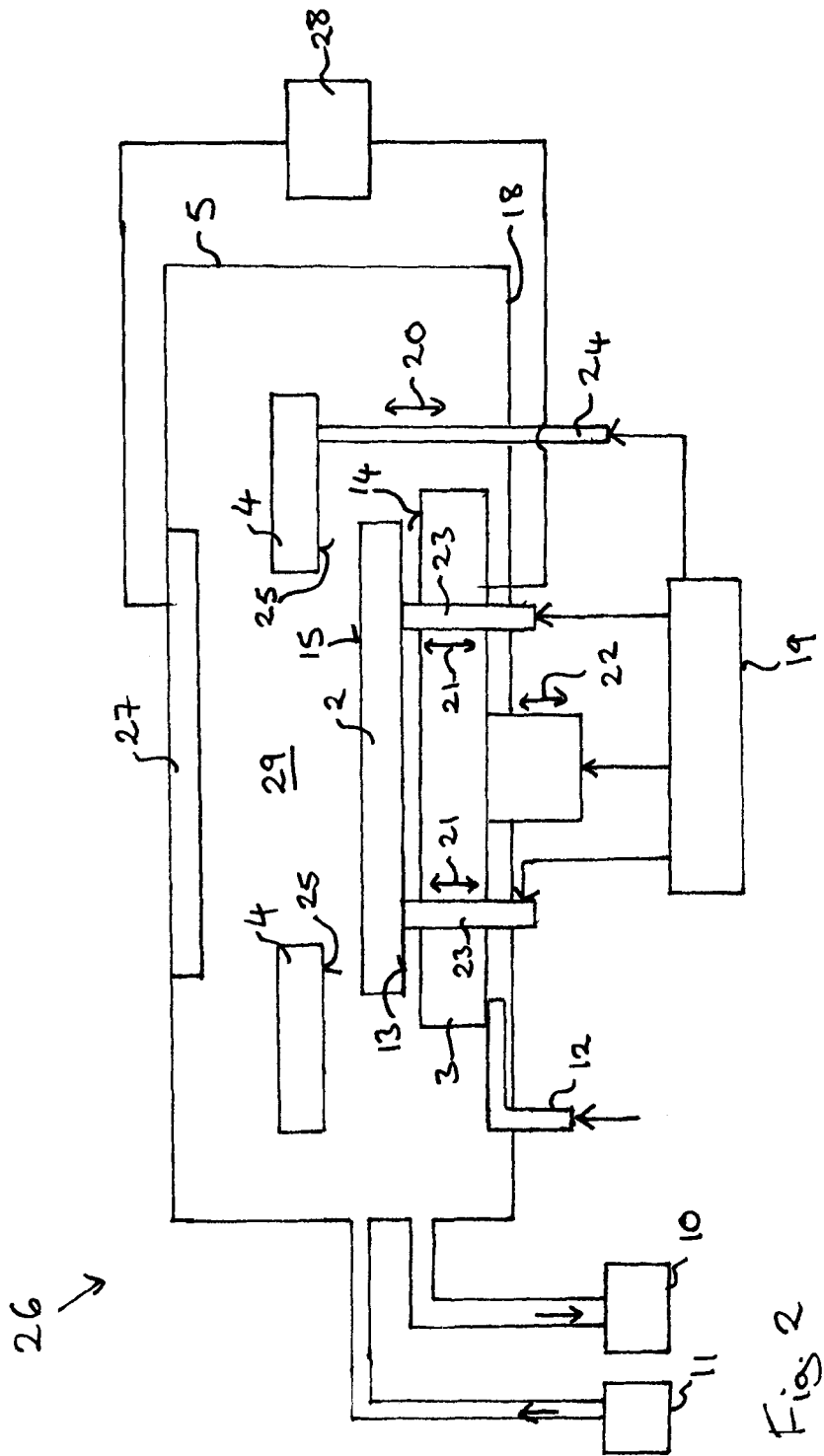
Figure 3:
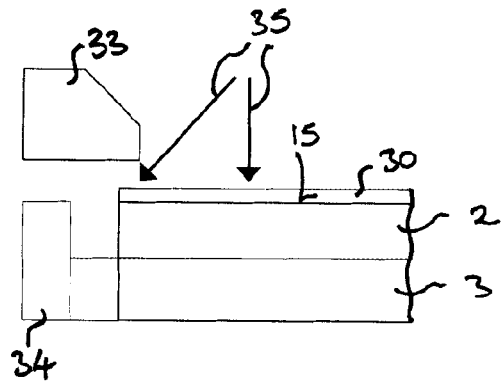
Figure 4:
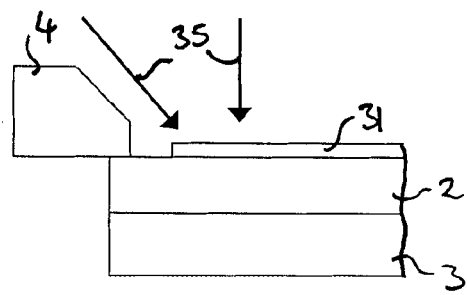
Figure 5:
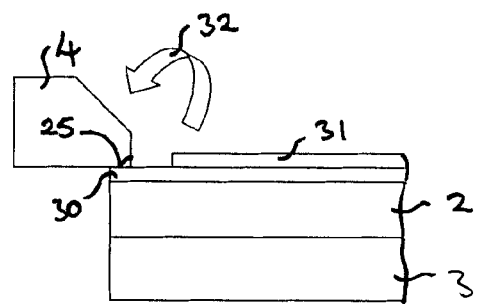
Figure 6:
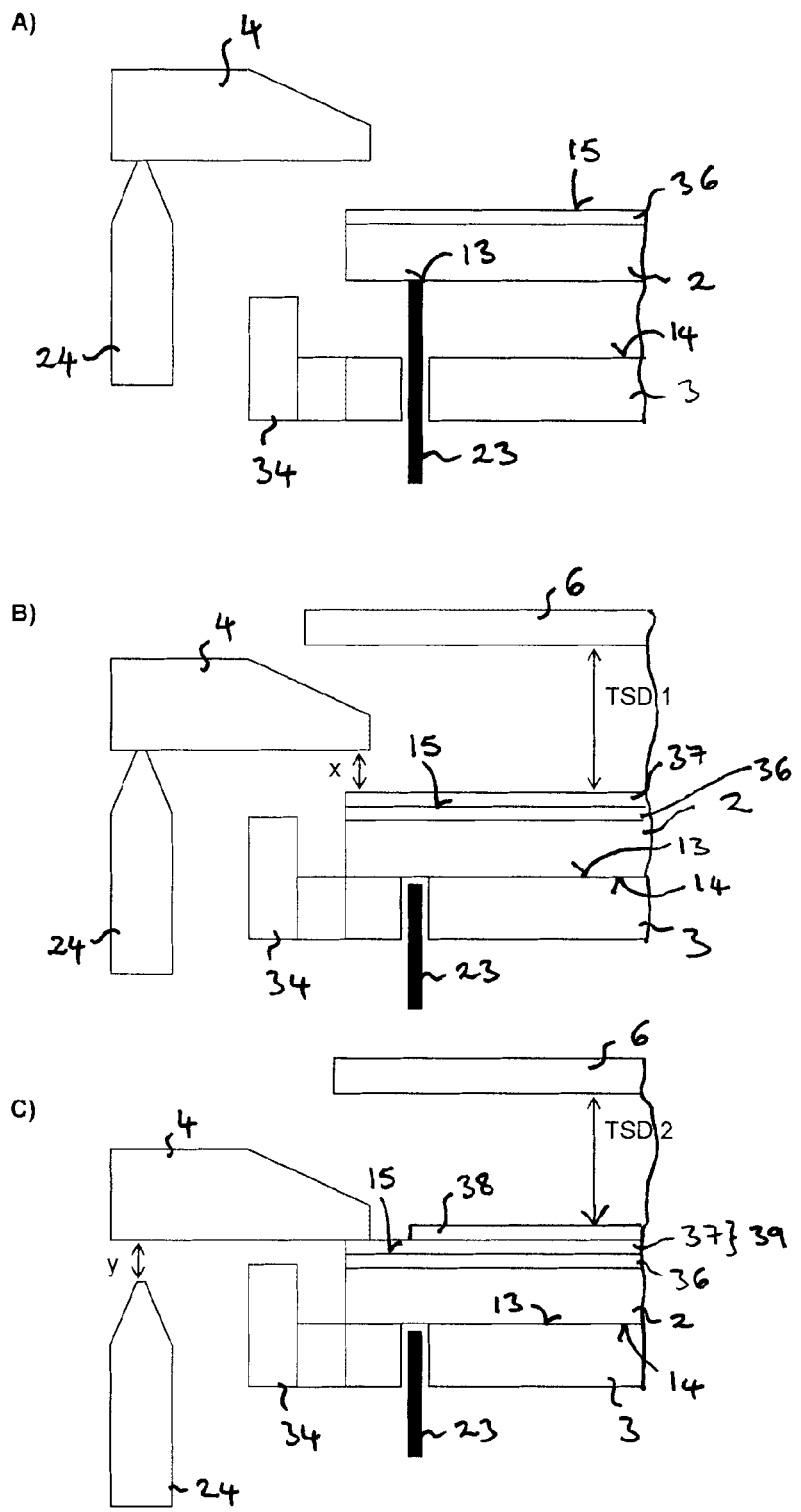

FIG. 1 illustrates apparatus according to a first embodiment for depositing a layer on a substrate by sputtering, FIG. 2 illustrates apparatus according to a second embodiment for depositing a layer on a substrate by plasma enhanced chemical vapour deposition, FIG. 3 illustrates an arrangement for depositing a layer on a substrate using only a shadow mask, FIG. 4 illustrates an arrangement for depositing a layer on a substrate using only a clamp, FIG. 5 illustrates arcing during deposition of electrically conductive layers on insulating substrates, FIG. 6 illustrates a method for depositing a layer on a substrate during which the clamp is moved with respect to the substrate, FIG. 7 illustrates a clamp according to the present invention, FIG. 8 illustrates movement of the clamp and the substrate relative to a source of material to be deposited.

FIG. 1 illustrates apparatus 1 for depositing a layer onto a substrate 2 using sputter deposition. The apparatus 1 comprises a chuck 3 for supporting the substrate 2, a clamp 4 for securing the substrate 2 to the chuck 3 and an evacuatable enclosure 5, which encloses the chuck 3, the substrate 2, the clamp 4, and a target 6 comprising a source of material which is to be sputtered onto the substrate 2. In this embodiment, the apparatus 1 comprises a magnetron sputtering arrangement and includes magnets 7 positioned behind a holder 8 onto which the target 6 is secured. The apparatus 1 includes a power source 9 applying a voltage across the target 6.

Although the apparatus 1 is illustrated as having a single holder and a single target, the apparatus is not limited to one holder and one target and may include two or more holders each with a respective target. Similarly, two or more substrates each associated with a clamp may be coated with a layer at the same time.

The apparatus 1 also includes an evacuation system 10 for evacuating the enclosure 5 and reducing the pressure within the enclosure 5 to less than ambient atmospheric pressure. The apparatus 1 further includes a gas supply system 11 for supplying processing gas into the enclosure 5 and a backside cooling system 12 for actively cooling the chuck 3 and a rear surface 13 of the substrate 2 when it is placed on a first surface 14 of the chuck 3. The backside cooling system 12 may comprise a flow of helium gas.

The clamp 4 is positioned between the target 6 and the chuck 3 so that the clamp 4 is positioned above a first side 15 of the substrate 2. The clamp 4 has the form of a ring having an inner diameter, which is slightly smaller than the outer diameter of the substrate 2 to enable the clamp 4 to contact the peripheral region of the substrate 2 and secure it in position on the chuck 3.

The clamp 4, the substrate 2 and the chuck 3 are each movable relative to one another and independently of one another so as to adjust the distance of the clamp 4 from the first side 15 of the substrate 2, indicated in FIG. 1, with reference number 16 and the distance between the rear surface 13 of the substrate 2 and the first surface 14 of the chuck 3, as indicated by reference number 17 in FIG. 1.

In particular, the height of the first surface 14 of the chuck 3, the first side 15 of the substrate 2 and clamp 4 relative to base 18 of the enclosure 5 and relative to the target 6 is adjustable by means of a plurality of height adjusting means whose position is controlled by control unit 19. The mechanical means for adjusting the height of the substrate 2, the chuck 3 and the clamp 4 may be positioned outside of the enclosure 5 to reduce the number of moving parts positioned within the enclosure 5 and simplify the construction of the apparatus 1.

The height of the clamp 4 and of the substrate 2 may be adjusted by means of height adjusters in the form of retractable pins, for example. Movement of the clamp 4 is illustrated in FIG. 1 with arrow 20, the movement of the substrate 2 is illustrated with arrow 21 and movement of the chuck 3 is illustrated by reference number 22.

The position of the substrate 2, the chuck 3 and the clamp 4 may be adjusted by the control unit 19 whilst the enclosure 5 contains a pressure which is less than ambient atmospheric pressure and whilst the processing gas is supplied by the gas supply system 11 into the enclosure 5. The control unit 19 is positioned outside of the enclosure 5. The connections between the control unit 19 and the height adjusters through a wall defining the enclosure 5 are vacuum tight so that the position of the substrate 2, the chuck 3 and the clamp 4 may be changed whilst the enclosure has a pressure which is less than atmospheric pressure.

In an embodiment, the position of the substrate 2, the chuck 3 and the clamp 4 may also be adjusted by the control unit 19 whilst the voltage is applied to the target 6 and material is deposited onto the substrate 2. This enables the position of the clamp 4 relative to the substrate 2 to be adjusted during the deposition of a film onto the first side 15 of the substrate 2.

The apparatus 1 may be used to deposit a layer onto the substrate 2 using the following method.

In an embodiment, the substrate 2 is positioned on pins 23 which protrude through the chuck 3 spacing the rear surface 13 of substrate 2 from the first surface 14 of the chuck 3 by a distance indicated with reference number 17. This position can be denoted as the load/unload position. The pins 23 are then retracted so that the rear surface 13 of the substrate 2 comes into contact with the first surface 14 of the chuck 3. A voltage is supplied to the target 6 and a first layer comprising elements of the target 6 is deposited onto the first side 15 of substrate 2 whilst the clamp 4 is positioned above, and spaced at a distance from, the first side 15 of the substrate 2 as indicated in FIG. 1 by distance 16.

After a predefined first time span and, therefore, after the deposited layer has reached a predefined thickness, the pins 24 supporting the clamp 4 are retracted, lowering the clamp 4 in a direction towards first side 15 of the substrate 2 until a lower inner surface 25 of the clamp 4 is in physical contact with the first side 15 of substrate 2 and secures the substrate 2 to the chuck 3. During this process, the reduced pressure of the enclosure 5 is maintained and a supply of processing gas into the enclosure 5 is maintained. Additionally, the voltage, i.e. power, supplied to the target 6 is also maintained and a further layer is deposited on the first side 15 and, in particular, onto the first layer already deposited on the first side 15 of the substrate 2 whilst the clamp 4 is in contact with the substrate 2 and secures the substrate 2 to the chuck 3.

As is illustrated in more detail in FIG. 6c, the lower inner surface 25 of the clamp 4 is in contact with edge regions of the first layer deposited on the first side 15 of substrate 2 whilst the clamp 4 is in contact with the substrate 2. In this position, the clamp 4 prevents deposition of material in the peripheral regions of the substrate resulting in a layer in which a central portion is thicker than a peripheral portion.

During a first time span, when the first layer is deposited without the clamp 4 being in contact with the first side 15 of the substrate 2, the chuck 3 is not actively cooled. This ensures that a flow of gas providing the backside cooling system 12 does not affect the position of the substrate 2 on the first surface 14 of the chuck 3 as, during this stage of the deposition process, the substrate 2 is supported only by its own weight on the first surface 14 of the chuck 3.

During a second stage of the deposition of the layer, after the clamp 4 secures the substrate 2 to the first surface 14 of the chuck 3, the backside cooling system 12 can be switched on as the clamp 4 secures the substrate 2 to the chuck 3. The further layer is deposited for a second time span during which the substrate 2 is actively cooled by the backside cooling system 12.

The substrate 2 may be a semiconductor wafer such as a silicon wafer which is typically generally circular and planar. The substrate 2 may be a composite substrate including a plurality of semiconductor devices arranged in a regular array and embedded in a plastic matrix. The substrate may also include an upper insulating layer such as a polyimide layer. This upper insulating layer may be structured to expose underlying electrically conductive contact regions. The apparatus 1 may be used to deposit a metal layer onto this substrate which is subsequently structured to provide a rewiring layer for the semiconductor devices.

FIG. 2 illustrates apparatus 26 according to a second embodiment for depositing a layer on a substrate 2. Apparatus 26 differs from the apparatus according to the first embodiment in that the layer is deposited using plasma enhanced chemical vapour deposition rather than sputtering. Therefore, the apparatus 26 does not include a source of material positioned within the enclosure 5, but comprises a first electrode 27 positioned within the enclosure 5 opposing the chuck 3, which serves as a second electrode.

The gas supply system 11 of apparatus 26 is adapted to provide gas comprising compounds with one or more elements which are to be deposited on the first side 15 of substrate 2. This gas is fed into the enclosure 5, which is held at a pressure less than the ambient atmospheric pressure, and decomposes within the volume 29 defined between the two electrodes 3, 27 and positioned above the first side 15 of substrate 2 in which a plasma is formed so that the metallic element or elements are deposited on the front side 15 of the substrate 2 and form a layer on the first side 15 of the substrate 2.

The apparatus 26 includes a chuck 3, onto which the substrate 2 is positioned, and a clamp 4 as in the first embodiment. As in the first embodiment, the position of the chuck 3, the substrate 2 and the clamp 4 are adjustable with respect to one another and independently of one another, in order that the substrate 2 may be brought into contact with the first surface 14 of chuck 3 and the position of the clamp 4 relative to the first side 15 of substrate 2 may be adjusted during deposition of a layer onto the first side 15 of the substrate 2.

The apparatus 26 may be operated as in the first embodiment. Whilst the clamp 4 is spaced at a distance in front of the first side 15 substrate 2 a first layer is deposited from the chemical vapour onto the first side 15 of the substrate 2. Subsequently, whilst the enclosure 5 is maintained under reduced pressure and the processing gas is supplied to the enclosure 5, the clamp 4 is brought into physical contact with first side 15 of substrate 2 comprising the first layer, such that the clamp 4 secures the substrate 2 to the first surface 14 of the chuck 3 and the deposition process continues to deposit a further layer in regions of substrate 2 not contacted by the clamp 4.

As in the first embodiment, in the first stage in which the clamp 4 is spaced distance from the substrate 2, the chuck 3 is not actively cooled. After the clamp 4 is brought into physical contact with the substrate 2, the backside cooling is switched on to actively cool the rear side 13 of the substrate 2 during the subsequent deposition of the layer onto the opposing first surface 15 of the substrate 2.

This invention relates to a system or apparatus for processing substrates, such as semiconductor wafers, with an improved clamping device which may be used for combined PVD processing without and with wafer clamping or combined CVD processing without and with wafer clamping in the same process chamber.

Further, a method for manufacturing a substrate like a wafer, in particular, a semiconductor wafer, is provided wherein the substrate is being processed while being not clamped during a first time span and clamped during a second time span within the same processing sequence. The method is applicable for physical vapour deposition and other treatment technologies under reduced pressure. A typical, but not limiting application is seed layer deposition for later electroplating. In this application a thin conductive layer is deposited on a substrate including its surface structures and serves as seed layer for a later galvanic deposition of metal, also described as electroplating or electro-deposition.

Processing as defined herein includes any chemical, physical or mechanical effect acting on substrates.

Substrates as defined herein are components, parts or workpieces to be treated in a processing apparatus. Substrates include, but are not limited to, flat, plate shaped parts having rectangular, square or circular shape. In an embodiment, the substrates are essentially planar, circular substrates, such as semiconductor wafers or composite wafers comprising semiconductor chips embedded in a plastic matrix.

A vacuum processing or vacuum treatment system or apparatus comprises at least an enclosure for substrates to be treated under pressures lower than ambient atmospheric pressure.

A chuck is a substrate holder adapted to fasten a substrate during processing. This clamping may be achieved, inter alia, by electrostatic forces (electrostatic chuck ESC), mechanical means or both. Chucks may exhibit additional facilities like temperature control components (cooling, heating) and sensors (substrate orientation, temperature, warping, etc.)

CVD or Chemical Vapour Deposition is a chemical process allowing for the deposition of layers on heated substrates. One or more volatile precursor material(s) are being fed to a process system where they react and/or decompose on the substrate surface to produce the desired deposit. Variants of CVD include:

Low-pressure CVD (LPCVD)—CVD processes at sub-atmospheric pressures; Ultrahigh vacuum CVD (UHVCVD)—CVD processes typically below $10^{-6}$ Pa/$10^{-7}$ Pa, and Plasma methods like Microwave plasma-assisted CVD (MPCVD), Plasma-Enhanced CVD (PECVD)=CVD processes that utilize plasma to enhance chemical reaction rates of the precursors.

Physical vapor deposition (PVD) is a general term used to describe any of a variety of methods to deposit thin films by the condensation of a vaporized form of a material onto a surface of a substrate (e.g. onto semiconductor wafers). The coating method involves purely physical processes such as high temperature vacuum evaporation or plasma sputter bombardment. Examples of PVD processes include Cathodic Arc Deposition, Electron beam physical vapor deposition, Evaporative deposition, Sputter deposition (i.e. a glow plasma discharge usually confined in a magnetic tunnel located on a surface of a target material).

The terms layer, coating, deposit and film are interchangeably used in this disclosure for a film deposited in vacuum processing equipment, be it CVD, LPCVD, plasma enhanced CVD (PECVD) or PVD (physical vapour deposition)

FIGS. 3 to 8 illustrate schematic views of one side of a symmetrical apparatus arrangement.

FIG. 3 illustrates a clampless system with a shadow mask 33 positioned spaced at a distance above the first surface 15 of the substrate 2 so that it is positioned between the substrate and the source of material to be deposited on the first surface 15 of the substrate 2. The substrate 2 is arranged on a pedestal or chuck 3. Typically, a shadow mask 33 and a protection ring 34 are used for the protection of regions around the chuck 3, namely the chuck top, pins etc. The deposited film 30 covers the whole exposed upper substrate surface 15 as is illustrated by arrows 35. This arrangement has the possible advantages that it is easy, simple, cheap, reliable, no risk of wafer damage and complete upper surface is exposed to the deposition step. Therefore, it is possible to later contact the wafer on the very outer edge for electroplating. The possible disadvantage of this arrangement is that it is not possible to use backside gas to cool the wafer.

FIG. 4 illustrates a mechanical clamping system. A clamp 4 mechanically fixates substrate 2 to the chuck 3. A small edge area is used to hold the substrate 2 and thus cannot be processed, i.e. material cannot be deposited underneath the clamp 4 in peripheral regions of the substrate 2. This is illustrated by retracted position of film 31 compared to the edge of the substrate 2. This arrangement has the possible advantages that it is easy, simple, cheap, reliable and allows backside gas and wafer cooling. However, it has the possible disadvantage that the uncoated substrate edge area provides no contact for electroplating and is therefore undesirable.

For the application of a seed layer for subsequent electroplating, each of these methods may not be sufficient if applied individually. However, if a combination of the two systems were to be used to avoid the above possible disadvantages, two separate chambers would be required. Step 1: deposition of a seed layer in a first chamber having a "clampless" arrangement as illustrated in FIG. 3 followed by a clamped deposition process in a second chamber as illustrated in FIG. 4. The process would be interrupted due to the need for two chambers.

Electrostatic clamping (ESC) could be used to secure the substrate to the chuck. Electrostatic clamping allows backside gas and wafer cooling and full face deposition, but is expensive and not always reliable, for example for dielectric substrates.

For wafer packaging processes such as seed layer deposition for electroplating, typically, wafer cooling and full face deposition are required. At the same time for economic reasons these processes required to allow low costs at high reliability.

Furthermore especially in wafer packaging more and more different substrate types are used, such as thinned silicon bonded on silicon, thinned silicon bonded on glass, polymer coated substrates and polymer substrates with embedded dies. These different substrate types cannot be handled by a single type ESC; in some cases its application may be even impossible.

As an additional possible disadvantage of a pure mechanically clamped solution is that in some cases, in particular when the deposition in deep features like TSV (through silicon via) is desired, the substrates may be exposed to a comparably high ion current. This can, for example, in the case of poor dielectrics, lead to potential differences between the clamp ring edge and the growing metal film. A spontaneous discharge between these different potentials can lead to damages of the growing metal film, so called "arc trees" as is illustrated schematically in FIG. 5 by arrow 32.

These possible disadvantages can be avoided by use of the apparatus illustrated in FIGS. 1 and 2 as this apparatus may be used to use both clampless and mechanically clamped arrangements within a single enclosure and for a single process sequence without switching off the processing gas and without interrupting deposition of material onto the substrate 2.

The method of moving the clamp 4 relative to the substrate 2 and chuck 3 during a single process sequence depositing a single film is illustrated in more detail in connection with FIG. 6.

FIG. 6a illustrates a substrate 2 loaded in the load position, where a clamp 4 having a ring-shape is resting on clamp lift pins 24, typically three pins 24, which are arranged adjacent to the substrate chuck 3 or protection ring 34 respectively. In case of circular substrates, pins 24 can be arranged with 120° angular distance. The second side 13 of the substrate 2 rests on wafer lift pins 23. The first side 15 of the substrate 2 comprises an insulating layer 36 in this embodiment. However, the insulating layer 36 is not mandatory and shall not limit the scope of the invention.

The position of chuck 3 is adjusted as is illustrated in FIG. 6b such that the substrate lift pins 23 retract and the substrate 2 is positioned on, and in physical contact with, the first surface 14 of the chuck 3. Chuck 3 is positioned until a first Target-substrate-distance TSD 1 has been reached. This TSD 1 is close or equal to the selected target substrate distance (TSD2) of the defined process.

FIG. 6b illustrates a so called shadow mask position, in which clamp 4 rests on the clamp lift pins 24 at a distance x, which may be around 1 to 5 mm, above the first side 15 of the substrate 2 This distance is selectable by adjustable clamp lift pins 24.

In the position illustrated in FIG. 6b, the process gas is switched on first to stabilize gas flow and pressure. No back side gas is used since the substrate 2 is not clamped. Backside cooling gas could otherwise affect the stable position of the substrate by lifting it.

Then the sputter power is switched on. If the process is using RF bias on the chuck, it is preferably not switched on in the shadow mask position as shown in FIG. 6b, since a first thin metal layer helps preventing possible damage on devices on the wafer. Furthermore without RF bias, the thermal load on the substrate is lower in this step of un-cooled operation. The sputtering time in shadow mask position is in the range between 5 and 50%, preferably 10 to 20%, of the total sputtering time depending on the requirements of electrical film conductivity to the wafer edge and substrate cooling. For electroplating a full face deposition of 10-50 nm is sufficient, depending on the material specific resistivity.

A first sub-layer 37 is deposited which covers the entire surface of the first side 15 of the substrate 2.

After having accomplished the shadow mask operation, the position of the chuck 3 is adjusted such that clamp 4 come into contact with the substrate 2 thus reducing the previous distance x to 0 as is illustrated in FIG. 6c. Clamp lift pins 24 retract from clamp 4 to a distance y. Thus the clamping force is given at least passively by the weight of the clamp 4 on the substrate 2. Of course also active means exerting active holding forces to the substrate can be applied. This positioning step can be accomplished with or without switching off the sputter power. However, the process gas is not switched off.

In the clamp position illustrated in FIG. 6c, the weight of the clamp 4 holds down the substrate 2 and secures it to the chuck 3 so that in this process step back side gas can be applied. The temperature difference (delta T) introduced by the initial sputter step is already sufficient to establish is a heat flow from the substrate to the cold chuck, which may be kept at cryogenic temperature like −20° C. RF bias may be applied if necessary.

A further sub-layer 38 is deposited in the first sub-layer 37 to from layer or film 39. The film thickness in this step depends on the time span of the second deposition step and on the product to be processed. For example for a through silicon via (TSV) with a high aspect ratio like in the range of 5:1 to 10:1 a film thickness between 1 and 2 µm may be required to provide sufficient seeding in the via.

After the deposition is completed, the chuck 3 is moved directly in the load position for unloading as illustrated in FIG. 6a.

The positioning steps as described above can be achieved by various relative movements of chuck 3, substrate 2 and clamp 4 in relation to the target 6. Clamp 4 can be moved by means of lift pins 24, the substrate 2 by means of substrate lift pins 23 and/or the chuck 3 may be moved relatively to the target. Depending on the construction of the process system various ways are possible to establish the relative movement. In an embodiment of the invention, the process flow described above is assisted by software included in control unit 19. Establishing the chuck height as a software parameter allows running automatic sequences of shadow and clamp mode position in production.

The adjustable clamp lift pin arrangement is used to select the shadow mask position or the clamp position. The distance x between clamp/shadow ring 4 and substrate 2 may be selected depending on the inner diameter of the clamp ring and the nature of the sputtered material. For example Cu or Au typically are more likely to scatter underneath edges than other materials and low sticking coefficients for the clamp ring 4 provide more material into gaps. This is different e.g. for Ti or Ta, where the deposition is typically more geometrically shadowed.

The layer 39 deposited onto the first side 15 of the substrate 2 has two sub-layers. A first sub-layer 37 extends to the edge of the substrate 2 and a second sub-layer 38 is positioned on the first sub-layer 37. The second sub-layer 38 has a lateral extent which is less than the first sub-layer 37. The layer 39 has a greater thickness in its centre and the smaller thickness at the periphery. This layer 39 can serve as an electrically conductive seed layer for the subsequent electro-deposition of a further layer, i.e. a further layer will be grown on the seed layer. The layer may comprise a metal or an alloy and may be described as metallic.

FIG. 7 illustrates the form of the clamp 4 is more detail. The clamp 4 typically has a ring-shape and typically uses an undercut 40 in its lower inner edge, i.e. in the region in which it contacts the substrate 2. The absolute inner diameter of the clamp 4 may be 2 to 3 mm smaller than the wafer radius, i.e. for a 300 mm wafer the diameter of the clamp would be in the range 294 to 296 mm, the actual contacting diameter being slightly higher due to the undercut of the clamp mask. In that case the shadow position of the disk above the wafer may be 2 to 4 mm above the wafer surface for Ti sputtering, whereas the same distance is 1 to 3 mm for Cu sputtering.

Typically the surfaces 41 directed towards the sputtering source or gap regions are either roughened, for example by sandblasting, or coated with layers, for example twin wire arc spray coating, preventing de-lamination of the growing film on the shields. As illustrated in FIG. 7 also the surfaces 42 of the inner regions and gaps of the clamp ring 4 needs to be prepared in such a way that a good adhesion of the scattered deposition is provided as is indicated by the dashed line 43.

The protection ring 34 is a simply removable part of the shield set and is also prepared for a good adhesion of the deposited films as is indicated by the dashed line 43. The upper surface 44 of the protection ring 34 is lower than the chuck surface 14, so that the substrate 2 will not touch the protection ring 34. However, the portion 25 of the clamp 4 contacting the substrate 2 is cleaned carefully, e.g. mechanically with mild abrasives, to avoid sharp edges contacting and possibly damaging the substrate 2.

FIG. 8 illustrates how the clamp 4 may be made adjustable for a wide TSD range by adjustable pins 24. The clamp position of the clamp 4 is indicated with dashed line 45 and the clamp position is indicated by solid line 46. This design includes a pump slot 47 between the clamp 4 and a concentric cylindric shield 48 which provides an invariable pumping speed for a wide TSD range.

Some advantages arising are as follows:
full face deposition is possible with temperature control without the application of an ESC. A reduced film thickness to the wafer edge is sufficient for a proper contact for electroplating;
a full face deposition step prior to clamped deposition avoids any risk of spontaneous discharges near the substrate edge, like arc trees, which may occur for some surface or substrate properties;
the possibility of running the two-step-process clampless/clamped in the same chamber is provided;
a continuous process without interruption of the power is possible;
easy control of the process sequence by the chuck height as a software parameter is provided;
the method is adjustable for a wide range of TSD with shadow mask positioning by pins with adjustable height, especially with a concentric cylindric shield setup providing invariable pumping speed, and
the method is applicable for different types of substrate such silicon, glass or polymer without any hardware change.

The invention claimed is:

1. A method for depositing a layer onto a substrate, comprising:
    inserting the substrate (2) into an evacuatable enclosure (5), and
    positioning the substrate (2) between a clamp (4) and a chuck (3) arranged within the enclosure (5), the chuck (3) including a cooling circuit for circulating a liquid or a gas through the cooling circuit, and
    whilst a pressure within the enclosure (5) is less than atmospheric pressure:
    supplying a processing gas to the enclosure (5);
    depositing a first layer (37) onto a first side the substrate (2) whilst supplying the processing gas and whilst the first side (15) of the substrate (2) is spaced at a distance from the clamp (4),
    bringing the clamp (4) into direct physical contact with at least a portion of the first layer (37) deposited on the first side (15) of the substrate (2), and
    depositing a further layer (38) onto the first layer (37) whilst maintaining a supply of the processing gas, whilst maintaining the pressure in the enclosure (5) at less than atmospheric pressure and whilst the clamp (4) is in physical contact with the at least a portion of the first layer and secures the substrate (2) to the chuck (3),
    wherein the clamp (4) does not contact the first side (15) of the substrate (2),
    wherein the first layer (37) is deposited without active cooling of the substrate (2) by not circulating the liquid or the gas through the cooling circuit, and
    wherein the further layer (38) is deposited with active cooling of the substrate (2) by circulating the liquid or the gas through the cooling circuit.

2. The method according to claim 1, further comprising placing the substrate (2) in contact with a first surface (13) of the chuck (3) before depositing the first layer.

3. The method according to claim 1 or claim 2, further comprising:
    placing the substrate (2) on moveable pins (23) which protrude above the first surface (13) of the chuck (3) and space the substrate (2) at a distance from the chuck (3), and
    placing the substrate (2) on the first surface (15) of the chuck (3) by retracting the pins (23).

4. The method according to claim 1, further comprising:
    supporting the clamp (4) on movable pins (24),
    moving the pins (24), and
    positioning the clamp (4) spaced at a distance above the first side (15) of the substrate (2) during deposition of the first layer (37).

5. The method according to claim 4, wherein the clamp (4) is brought into contact with the first side (15) of the substrate (2) by retracting the pins (24).

6. The method according to claim 1, wherein the chuck (3) is movable and the chuck (3) is moved relative to the clamp (4) and the clamp (4) is brought into contact with the first side (15) of the substrate (2).

7. The method according to claim 1, further comprising applying energy to a material source (6) comprising material to be deposited whereby portions of the material source (6)

are removed, deposited onto the substrate (2) and form the layer (39) on the first side (15) of the substrate (2).

8. The method according to claim 7, wherein the portions of the material source (6) that are removed comprise one or more elements which are deposited onto the substrate (2) and form a metallic layer on the substrate (2).

9. The method according to claim 1, further comprising supplying gaseous material to the enclosure (5), the gaseous material comprising one or more compounds which react within the enclosure (5), releasing one or more elements which are deposited onto the substrate (2) and form the layer (39).

10. The method according to claim 9, wherein the one or more elements deposited onto the substrate (2) form a metallic layer on the substrate (2).

11. The method according to claim 1, wherein the substrate (2) comprises a semiconductor.

12. The method according to claim 11, wherein the substrate (2) comprises a semiconductor wafer or a composite comprising semiconductor portions embedded in a plastic matrix.

13. The method according to claim 1, wherein a thickness of the first layer (37) is monitored during deposition and the clamp (4) is brought into contact with the at least a portion of the first layer when the first layer (37) has a pre-defined thickness.

14. The method according to claim 1, wherein the first layer (37) is deposited for a first time span and the further layer (38) is deposited for a second time span.

15. The method according to claim 14, wherein the first layer (37) and the further layer (38) are deposited over a total time span and the first time span is between 1% and 50% of the total time span.

16. The method according to claim 15, wherein the first time span is between 10 to 20% of the total time span.

\* \* \* \* \*